United States Patent

Mullen, III et al.

[11] Patent Number: 5,177,134
[45] Date of Patent: Jan. 5, 1993

[54] TACKING AGENT

[75] Inventors: William B. Mullen, III, Boca Raton; Anthony B. Suppelsa, Coral Springs; Robert W. Pennisi, Boca Raton, all of Fla.

[73] Assignee: Motorola, Inc., Schaumburg, Ill.

[21] Appl. No.: 622,027

[22] Filed: Dec. 3, 1990

[51] Int. Cl.$^5$ .............................................. C08K 5/10
[52] U.S. Cl. ................................. 524/284; 524/320; 524/321; 524/322
[58] Field of Search ................ 524/320, 321, 322, 284

[56] References Cited

U.S. PATENT DOCUMENTS

| | | | |
|---|---|---|---|
| 4,071,489 | 1/1978 | Emmons et al. | 525/32.1 |
| 4,145,503 | 3/1979 | Emmons et al. | 526/282 |
| 4,216,035 | 8/1980 | Bakos et al. | 148/25 |
| 4,261,872 | 4/1981 | Emmons et al. | 260/22 CB |
| 4,557,767 | 12/1985 | Hwang | 148/23 |
| 4,619,715 | 10/1986 | Hwang | 148/23 |
| 4,720,324 | 1/1988 | Hayward | 156/645 |
| 4,762,573 | 8/1988 | Biverstedt | 148/24 |
| 4,916,805 | 4/1990 | Ellrich et al. | 29/832 |
| 4,988,395 | 1/1991 | Taguchi et al. | 148/24 |
| 4,995,921 | 2/1991 | Davis et al. | 148/25 |

FOREIGN PATENT DOCUMENTS 62-267354  11/1987  Japan ................................. 524/321

Primary Examiner—Paul R. Michl
Assistant Examiner—John J. Guarriello
Attorney, Agent, or Firm—Dale W. Dorinski

[57] ABSTRACT

A tacking agent is provided for use in temporarily adhering electronic components and providing fluxing properties for soldering electronic assemblies. The tacking agent comprises a fluxing agent and a tackifier. The fluxing agent is composed of one or more carboxylic acids having the formula

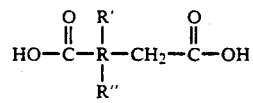

where R is an alkyl group containing from 1 to 6 carbon atoms, R' is selected from the group consisting of hydrogen and hydroxyl, and R" is selected from the group consisting of hydrogen, hydroxyl and carboxyl. The tackifier comprises one or more alcohols, aromatic hydrocarbon solvents, aliphatic hydrocarbon solvents, or polymers. The tacking agent is deposited onto a printed circuit board or other substrate, the electronic components are placed into the deposited tacking agent and soldered. During solder reflow the fluxing agent provides fluxing action for the soldering process, and the tackifier volatilizes, leaving little or no residue on the printed circuit board.

13 Claims, No Drawings

TACKING AGENT

CROSS REFERENCE TO RELATED APPLICATIONS

This application is related to U.S. patent application Ser. No. 07/583,630 filed on Sep. 17, 1990. U.S. Pat. No. 5,122,200 which relates to solder paste formulations that produce a residue that is cleanable with formic acid and is related to U.S. patent application Ser. No. 07/607,387 filed on Oct. 31, 1990 now U.S. Pat. No. 5,116,433 which relates to solder paste formulations that contain formate complexes as oxide scavengers.

TECHNICAL FIELD

This invention relates generally to manufacturing printed circuit assemblies, and in particular, to a material for temporarily adhering surface mount components to a printed circuit assembly.

BACKGROUND

The process of assembling electronic circuitry involves placing and soldering leaded and leadless components on a printed circuit board. During the assembly process, the components must be maintained in their proper positions prior to and during the soldering operation. In the case of leaded components, when the leads are inserted into holes in the printed circuit board they serve to aid in fixturing the component in place during the soldering operation. In both leaded and leadless component soldering, there exists a need to fixture the components so that the components do not move and remain in place.

This is accomplished by the use of an adhesive strategically placed underneath or along side the component. The adhesive is normally dispensed or deposited onto the printed circuit board and the components are placed in the adhesive and the adhesive is cured either thermally or with ultraviolet light. Solder is applied to the printed circuit board by stencilling or printing a solder paste, by cladding the printed circuit board with solder prior to assembly, or by wave soldering. In each of these cases, a solder flux must be provided in order to facilitate a sound metallurgical solder joint. Solder flux is normally formulated into the solder paste, applied as a coating over the entire circuit board when wave soldering, or is applied separately when solder clad circuit boards are used.

After soldering, the flux residue is removed from the board. This is typically accomplished by cleaning the soldered assembly in either an aqueous or organic cleaning solvent. The existence of an adhesive material underneath or adjacent to components provides a hindrance to cleaning and removing all traces of solder flux from beneath components. The standard industry practice to secure components in place is to use a thermosetting adhesive which cannot be removed after soldering. The cleaning operation is an expensive additional step and, in the case of organic solvents, utilizes material such as chlorofluorocarbons which have been deemed to be environmentally hazardous.

The prior art has attempted to utilize conventional soldering fluxes to hold component leads in place during soldering operations. U.S. Pat. No. 4,720,324 discloses the use of solder flux coated over the entire surface of the printed circuit board, and while in a tacky state, the components are added. The tack or stickiness of the flux is purported to hold the components in place. While it is clear that conventional soldering flux does provide some degree of tackiness, this method does not function adequately. The resulting coating is too thin to act as a sufficient tacking agent, and when small, closely spaced components are soldered, the components tend to be drawn to one another by surface tension and do not stay in place. Non-selective coating of the printed circuit board cannot be used with these small, light components, as they tend to swim about in the flux.

Clearly, there exists a need for a material that provides a temporary fixturing means for the components and also provides fluxing action for the soldering operation. In addition, such a material would ideally not need to be removed after the soldering operation, leaving no traces of solder flux residue or adhesive material surrounding the components.

SUMMARY OF THE INVENTION

Briefly, according to the invention, a tacking agent is provided for use in temporarily adhering electronic components and providing fluxing properties for soldering electronic assemblies. The tacking agent comprises a fluxing agent and a tackifier. The fluxing agent is composed of one or more carboxylic acids having the formula

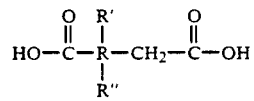

where R is an alkyl group containing from 1 to 6 carbon atoms, R' is selected from the group consisting of hydrogen and hydroxyl, and R'' is selected from the group consisting of hydrogen, hydroxyl and carboxyl. The tackifier comprises one or more alcohols, aromatic hydrocarbon solvents, aliphatic hydrocarbon solvents, or polymers. Alcohols used as tackifiers have the structural formula R—OH where R is an alkyl group containing from 1 to 12 carbon atoms. The polymers are composed of a material selected from the group consisting of polyisobutylene, polyacrylates, alpha-substituted polyesters, polyalkylene carbonates and polyterpenes.

The tacking agent is deposited onto a printed circuit board or other substrate, and the electronic components are placed into the deposited tacking agent. During solder reflow the fluxing agent provides fluxing action for the soldering process, and the tackifier volatilizes, leaving little or no residue on the printed circuit board.

In an alternate embodiment of the invention, the tackifier does not volatilize, but remains in place as a conformal coating or encapsulant.

In a further embodiment of the invention, the tackifier decomposes upon exposure to ultraviolet light, and is further volatilized during solder reflow.

DETAILED DESCRIPTION OF THE PREFERRED EMBODIMENT

Adhesives used for permanent component placement serve no purpose except to retain the components. Cleaning of the solderable surfaces in preparation for soldering is usually accomplished by applying a flux as a secondary operation. The flux leaves a residue which requires removal with a cleaning agent. In the described invention, adhesion and retention of the component is provided by a tacking agent comprising compounds which produce a fluxing action and volatilize during the soldering process, leaving behind a passive, clean surface. In another embodiment, component retention is provided by compounds which partially volatilize during the soldering process leaving a clean, waxy coating in place, eliminating the need for conformal coating. In still another embodiment of the invention, component retention is provided by compounds which are photodegraded and volatilized during the soldering process while providing a fluxing action. The photodegradation is accomplished by means of ultraviolet light applied to the tacking agent during the soldering operation, reducing the larger molecules to smaller and more volatile molecules.

Application of the tacking agent to the printed circuit board is accomplished by means of a glue dispensing head on automatic leadless component placement equipment. Dispensing of the tacking agent is done in a manner similar to dispensing of conventional adhesives. The tacking agent is applied to the solder pads of the printed circuit board. The tacking agent may also be applied by other means such as painting, stenciling, or printing the tacking agent onto the printed circuit board.

The functions of the tacking agent are accomplished by means of a tackifier and a fluxing agent. The tackifier is typically a medium-to-high viscosity, high-surface tension liquid serving to wet the printed circuit board and the component, and retain the component in position during handling and reflow soldering. Typical materials used for tackifiers are benzyl alcohol, dodecanol, 2,5-hexanediol, glycerol, low-melting waxes, and high-viscosity oils. Other materials may be used as solvents for the tackifiers and fluxing agents, for example alcohols (such as isopropanol, normal propanol, methanol, ethanol, or butanol), aromatic solvents (such as xylene and toluene), and aliphatic solvents (such as hexane, octane, naphtha, and mineral spirits). Selection of materials for the tackifier is determined by the viscosity needs of the tacking agent. Larger components and components more subject to displacement during assembly require a more highly viscous tackifier. The tackifier should be selected so that the boiling point of the tackifier is near the operating temperatures found during the soldering operations in order that the tackifier will be volatilized during the soldering operations. Low molecular weight polymers such as polyisobutylene, polyacrylates, alpha-substituted polyesters, polyterpenes, or rosin acid esters may also be placed in the formulation to provide desired dispensing and wetting properties.

The second function, that of a fluxing agent, is accomplished by the use of carboxylic acids which provide fluxing action to the oxides of tin and lead normally found in soldering. At elevated temperatures carboxylic acids react with the tin and lead oxides to remove the oxides from the surface of the components and the printed circuit board. During the soldering operation, the fluxing agent volatilizes leaving no residue on the circuit board. Carboxylic acids which have been found to be effective in producing solderable surfaces at levels of 0.1–10 percent concentration are adipic acid, ascorbic acid, citric acid, and malic acid, with malic acid being the preferred material. These acids decompose or volatilize at temperatures below 300° C. Other acids that have higher volatilization temperatures may be used at higher concentrations because of their lower acid activity.

The novel compositions of the present invention will be more fully understood from a consideration of the following examples illustrating preferred embodiments. It is to be understood, however, that these examples are given by way of illustration and not of limitation.

EXAMPLE 1

|  | Wt. % |
| --- | --- |
| Malic acid | 5 |
| 2,5-hexanediol | 20 |
| Benzyl alcohol | 75 |

The composition of a tacking agent consists of a mixture of organic carboxylic acids and a vehicle or solvent in which the acid has good solubility. The malic acid is mixed into the alcohols at room temperature and is then heated until a homogeneous solution has formed into a high viscosity (approximately 20–1500 centipoise) high-surface tension (approximately 30–80 dynes per centimeter) liquid. The resulting mixture is cooled to room temperature and applied to a printed circuit board and reflowed.

The solderability and tackiness of the formulation was good. The tacking agent was applied to copper foil, and tin/lead eutectic solder spheres were placed into the tacking agent. The solder spheres did not move when the foil was tilted or inverted prior to reflow. Upon heating to reflow temperatures between 190° and 250° C., the solder spheres coalesced and wet to the copper foil. After reflow, no visible residue was found on the foil when examined with the unaided eye.

COMPARATIVE EXAMPLE 1

A printed circuit board was coated with a rosin based wave soldering flux (Alpha 100 from Alpha Chemicals, Inc), and allowed to partially air dry. Leadless chip resistors (approximately 80 mils wide and 120 mils long) were added to the printed circuit board, and the assembly reflowed. When the printed circuit board was tilted, the components moved out of position. Some of the components soldered to the correct pads, and others moved to their 'nearest neighbors' and were soldered in the wrong locations. After soldering, the board was very sticky and had to be cleaned in alcohol and chlorofluorocarbon solvents.

EXAMPLE 2

|  | Wt. % |
| --- | --- |
| Malic acid | 0.5 |
| Methanol | 15.0 |
| 1-dodecanol | 84.5 |

The malic acid is mixed into the alcohols at room temperature and is then heated until a homogeneous solution has formed into a high viscosity (approximately 20–1500 centipoise) high-surface tension (approximately 30–80 dynes per centimeter) liquid. The resulting mixture is applied to a printed circuit board, and reflowed as in Example 1.

EXAMPLE 3

|  | Wt. % |
| --- | --- |
| Malic acid | 5 |

-continued

| | Wt. % |
|---|---|
| Isopropanol | 10 |
| 1-dodecanol | 85 |

The mixture is made and tested in the same fashion as the previous example.

EXAMPLE 4

| | Wt. % |
|---|---|
| Adipic acid | 0.5 |
| Benzyl alcohol | 15.0 |
| 1-dodecanol | 84.5 |

The mixture is made and tested in the same fashion as the previous example.

EXAMPLE 5

| | Wt. % |
|---|---|
| Malic acid | 0.5 |
| Methanol | 15 |
| 1-dodecanol | 54.5 |
| Sylvantac 40N | 30 |

The malic acid is mixed into the alcohols at room temperature and is then heated until a homogeneous solution has formed into a high viscosity (approximately 20-1500 centipoise) high-surface tension (approximately 30-80 dynes per centimeter) liquid. The Sylvantac 40N (available from Arizona Chemicals) is then added and mixed until uniform, and cooled to room temperature. The resulting mixture is applied to a printed circuit board, and reflowed as in Example 1. A small amount of residue was present after soldering.

EXAMPLE 6

| | Wt. % |
|---|---|
| Malic acid | 3 |
| Toluene | 80 |
| Zonarez Type Alpha 25 | 17 |

The mixture is made and tested in the same fashion as the previous example.

EXAMPLE 7

| | Wt. % |
|---|---|
| Malic acid | 3 |
| Methanol | 20 |
| Toluene | 50 |
| Polyisobutylene (MW = 800) | 27 |

The malic acid is mixed into the alcohol and toluene at room temperature and is then heated until a homogeneous solution has formed into a high viscosity (approximately 20-1500 centipoise) high-surface tension (approximately 30-80 dynes per centimeter) liquid. The polyisobutylene (MW=800) available from Polysciences) is then added and mixed until uniform, and cooled to room temperature. The resulting mixture is applied to a printed circuit board, and reflowed as in Example 5.

EXAMPLE 8

| | Wt. % |
|---|---|
| Malic acid | 3 |
| Methanol | 20 |
| Toluene | 50 |
| Poly(2-ethylhexylacrylate) | 27 |

The mixture is made and tested in a similar fashion as the previous example. The poly(2-ethylhexylacrylate) is available from Aldrich Chemical Co.

In another embodiment, tacking agents containing tackifiers that function as encapsulants or conformal coating may be compounded by utilizing waxes or other materials as tackifiers. These tacking agents contain the same organic acids and solvents in similar concentrations as the previous examples. To these mixtures, a carnauba wax, a microcrystalline wax, or other inert dielectric materials with melting points in the range of 30°-260° C. are added. In cases where the acid is not soluble in the solvent/wax mixture, a suspension is formulated with the acid, or the formulation is applied in two parts. During the reflow soldering operations, the tackifier serves to hold the component in place but does not volatilize as in the previous examples. The tackifier remains after the soldering operation to exist as a waxy material that surrounds the component. In order to function as a conformal coat or encapsulant, the tackifier must be non-volatile at or below soldering temperatures and must exhibit good wetting to all surfaces normally found in printed circuit board technology. Materials used as conformal coating agents in the tacking agents are polyisobutylene, polyacrylate, alpha-substituted polyesters, and polyterpene, and waxes such as carnauba wax. Other low-molecular weight polymers or hot-melt adhesives are also employed.

EXAMPLE 9

| | Wt. % |
|---|---|
| Malic acid | 3 |
| Methanol | 20 |
| Toluene | 40 |
| Carnauba wax | 37 |

The malic acid and methanol are added together and heated to about 70° C. until the malic acid completely dissolves. The toluene and wax are added and the solution is again heated to 40°-80° C. to melt the wax. The solution is continually stirred to promote mixing. When cooled to room temperature, the mixture will be of a soft solid consistency. Heating the mixture to about 50° C. will result in a liquid solution that may be applied by spraying. Screen printing and dispensing of the tacking agent is performed at room temperature. The mixture was tested in a similar fashion as the previous examples.

EXAMPLE 10

| | Wt. % |
|---|---|
| Malic acid | 3 |
| Methanol | 20 |
| VM&P Naptha | 40 |
| Microcrystalline wax | 37 |

The malic acid and methanol are added together and heated to about 70° C. until the malic acid completely dissolves. The VM&P Naptha and wax are added and the solution is again heated to 40°-80° C. to melt the wax. The solution is continually stirred to promote mixing. When cooled to room temperature, the mixture will be of a soft solid consistency. Heating the mixture to about 50° C. will result in a liquid solution that may be applied by spraying. Screen printing and dispensing of the tacking agent is performed at room temperature. The dispensing consistency is modified by reducing the amount of VM&P Naptha to create a firmer mixture at room temperature. A softer, tackier mixture is formed by adding a medium boiling point solvent such as: N-butanol (BP 117.7C), hexanol (BP 156C), octane (BP 125C), toluene (BP 111C), or xylene (BP 137-144C).

EXAMPLE 11

|  | Wt. % |
| --- | --- |
| Solution A |  |
| Malic acid | 4 |
| Methanol | 16 |
| Solution B |  |
| VM&P Naptha | 70 |
| Microcrystalline wax | 10 |

Solution A is prepared by mixing the malic acid in the methanol and heating it to 70°-80° C. until the acid goes into solution. Solution B is prepared by mixing the wax in the Naptha at room temperature and heating until the wax melts (approximately 80° C.). Because of the limited solubility of the malic acid in the naptha/wax mixture, the application of this tacking agent must take place in two parts. Solution A is first applied to the substrate or component by spraying or dipping. The solvent is removed by drying at room temperature. After drying, Solution B is applied to the substrate at room temperature. The component is then placed on the substrate and reflow soldered.

In a further embodiment, tackifiers which are decomposed by ultraviolet light consist of low molecular weight polymers such as polyesters, polyacrylates, or polydiene resins. In addition, photoinitiators which react with ultraviolet light to accomplish secondary reactions degrading the polymer materials are also used. Other materials containing structural units which are liable to fracture or degradation by ultraviolet light may be used by those with ordinary skill in the art. After dispensing the photodegradable tacking agent onto the circuit board, the low boiling alcohols quickly evaporate leaving a sticky residue for placement of the components. The high boiling alcohols and solvents remain in place until the reflow temperatures are achieved. Just prior to or during reflow, the tacking agent is exposed to high-intensity ultraviolet light, degrading the polymers into fragments which are easily volatilized at the reflow temperatures.

EXAMPLE 12

|  | Wt. % |
| --- | --- |
| Malic acid | 2 |
| Methanol | 8 |
| Ethylene Carbonate | 78 |
| Napthalane | 2 |
| Polypropylene carbonate | 10 |

The malic acid was dissolved in methanol and the polypropylene carbonate was dissolved in the ethylene carbonate at about 35° C. The two separate solutions were mixed together and stirred. Napthalane was added and the mixture heated to about 50° C. and stirred until homogeneous. The mixture was tested in a similar fashion as the previous examples.

Various changes and modifications in the tacking agent formulations herein disclosed may occur to those skilled in the art; and to the extent that such changes and modifications are embraced by the appended claims, it is to be understood that they constitute part of the present invention.

What is claimed is:

1. A tacking agent suitable for temporarily fixturing electronic components and serving as a solder flux, consisting essentially of:
   a carboxylic acid compound having the property of vaporizing or decomposing at temperatures between ambient and 300° C., in an amount effective to serve as a solder flux;
   one or more alcohol thickeners having one or more hydroxyl groups, suitable for forming a viscous solution or suspension of the carboxylic acid compound, said viscous solution having a viscosity of between 20 and about 1500 centipoise, and said alcohol thickener also serving as a fugitive solvent by vaporizing or decomposing between said temperatures; and
   one or more materials selected from the group consisting of polyisobutylene, polyacrylates, alpha-substituted polyesters, polyterpenes, and organic carbonates.

2. A tacking agent suitable for temporarily fixturing electronic components and serving as a solder flux, consisting essentially of;
   a carboxylic acid compound having the property of vaporizing or decomposing at temperatures between ambient and 300° C., in an amount effective to serve as a solder flux;
   one or more alcohol thickeners having one or more hydroxyl groups, suitable for forming a viscous solution or suspension of the carboxylic acid compound, said viscous solution having a viscosity of between 20 and about 1500 centipoise, and said alcohol thickener also serving as a fugitive solvent by vaporizing or decomposing between said temperatures; and
   an electrically non-conducting encapsulant material having a melting point between about 45 and about 260 degrees C.

3. The tacking agent of claim 2, wherein the encapsulant material comprises carnauba wax.

4. A tacking agent suitable for temporarily fixturing electronic components and serving as a solder flux, consisting essentially of;
   a carboxylic acid compound having the property of vaporizing or decomposing at temperatures between ambient and 300° C., in an amount effective to serve as a solder flux;
   one or more alcohol thickeners having one or more hydroxyl groups, suitable for forming a viscous solution or suspension of the carboxylic acid compound, said viscous solution having a viscosity of between 20 and about 1500 centipoise, and said alcohol thickener also serving as a fugitive solvent by vaporizing or decomposing between said temperatures; and a photodegradable polymer.

5. The tacking agent of claim 4, wherein the photodegradable polymer is a polymer selected from the group consisting of polyesters, polyacrylates and diene resins.

6. A tacking agent for use in temporarily adhering components and serving as a solder flux, consisting essentially of;

a fluxing agent composed of a dicarboxylic acid compound having the formula

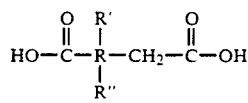

where R is an alkyl group containing from 1 to 6 carbon atoms, R' is selected from the group consisting of hydrogen and hydroxyl, and R" is selected from the group consisting of hydrogen, hydroxyl and carboxyl; and wherein the proportion of the dicarboxylic acid ranges from about 0.1 to about 10 weight percent of the tacking agent;

a tackifier suitable for forming a viscous solution or suspension of the dicarboxylic acid, comprising one or more materials selected from the group consisting of;

alcohols having the formula R—OH or HO—R—OH, where R is an alkyl group containing from 1 to 12 carbon atoms, or R is an aromatic group;

a material selected from the group consisting of polyisobutylene, polyacrylates, alpha-substituted polyesters, polyterpenes, and organic carbonates; and aromatic hydrocarbon solvents and aliphatic hydrocarbon solvents; and an electrically non-conducting encapsulant material having a melting point between about 45 and about 260 degrees C.

7. The tacking agent of claim 6, wherein the encapsulant material comprises carnauba wax.

8. A tacking agent for use in temporarily adhering components and serving as a solder flux, consisting essentially of;

a fluxing agent composed of a dicarboxylic acid compound having the formula

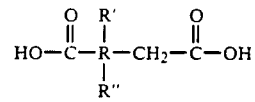

where R is an alkyl group containing from 1 to 6 carbon atoms, R' is selected from the group consisting of hydrogen and hydroxyl, and R" is selected from the group consisting of hydrogen, hydroxyl and carboxyl; and wherein the proportion of the dicarboxylic acid ranges from about 0.1 to about 10 weight percent of the tacking agent;

a tackifier suitable for forming a viscous solution or suspension of the dicarboxylic acid, comprising one or more materials selected from the group consisting of;

alcohols having the formula R—OH or HO—R—OH, where R is an alkyl group containing from 1 to 12 carbon atoms, or R is an aromatic group;

a material selected from the group consisting of polyisobutylene, polyacrylates, alpha-substituted polyesters, polyterpenes, and organic carbonates; and aromatic hydrocarbon solvents and aliphatic hydrocarbon solvents; and a photo-degradable polymer.

9. The tacking agent of claim 8, wherein the photodegradable polymer is a polymer selected from the group consisting of polyesters, polyacrylates and diene resins.

10. A tacking agent for use in soldering electronic assemblies, comprising:

malic acid, where the proportion of malic acid ranges from about 0.1 to about 10 weight percent of the tacking agent;

a thickener selected from the group consisting of polyisobutylene, polyacrylates, alpha-substitute polyesters, polyterpenes, and organic carbonates; and a solvent suitable for forming a viscous solution or suspension of the malic acid and the thickener, said viscous solution or suspension having a viscosity of between about 20 and about 1500 centipoise, the solvent vaporizing while soldering the electronic assemblies.

11. The tacking agent of claim 10, wherein the tacking agent further comprises a dielectric encapsulant material having a melting point between about 45 and about 260 degrees C.

12. The tacking agent of claim 11, wherein the encapsulant material comprises carnauba wax.

13. The tacking agent of claim 10, wherein the tacking agent further comprises a photo-degradable polymer selected from the group consisting of polyesters, polyacrylates carbonate polymers, organic carbonates and diene resins.

* * * * *